(12) United States Patent
Kang et al.

(10) Patent No.: US 10,762,248 B2
(45) Date of Patent: Sep. 1, 2020

(54) METHOD FOR CONTROLLING STRUCTURAL MEMBER DESIGN CONSIDERING CONSTRUCTABILITY OF FORMWORK

(71) Applicant: KOREA UNIVERSITY RESEARCH AND BUSINESS FOUNDATION, Seoul (KR)

(72) Inventors: Kyung In Kang, Seoul (KR); Hun Hee Cho, Seoul (KR); Tae Hoon Kim, Gwangju (KR); Dong Min Lee, Daejeon (KR); Hyun Su Lim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 602 days.

(21) Appl. No.: 15/612,621

(22) Filed: Jun. 2, 2017

(65) Prior Publication Data
US 2017/0351784 A1 Dec. 7, 2017

(30) Foreign Application Priority Data

Jun. 3, 2016 (KR) .................. 10-2016-0069564
Jun. 30, 2016 (KR) .................. 10-2016-0082925

(51) Int. Cl.
*G06F 30/13* (2020.01)
*G06K 9/00* (2006.01)

(52) U.S. Cl.
CPC ......... *G06F 30/13* (2020.01); *G06K 9/00476* (2013.01)

(58) Field of Classification Search
CPC . G06F 17/5004; G06F 30/13; G06K 9/00476; G06Q 50/04; G06Q 10/043
See application file for complete search history.

(56) References Cited

U.S. PATENT DOCUMENTS

| | | | |
|---|---|---|---|
| 8,352,218 B2 * | 1/2013 | Balla ................... | G06F 17/5004 345/419 |
| 8,688,411 B2 * | 4/2014 | Vanker ..................... | E04B 1/24 703/1 |
| 2016/0210375 A1 * | 7/2016 | Chen ................... | G06F 17/5004 |

FOREIGN PATENT DOCUMENTS

| | | | | |
|---|---|---|---|---|
| EP | 2648119 | * 10/2013 | ............. | G06F 17/50 |
| JP | 2009-187157 A | 8/2009 | | |

(Continued)

OTHER PUBLICATIONS

Lucko et al. "Rapid Deployment of Simulation Models for Building Construction Applications" Proceedings of the 2009 Winter Simulation Conference, pp. 2733-2744 [retrieved on Nov. 29, 2019]. Retrieved from <https://ieeexplore.ieee.org/document/5429255/> (Year: 2009).*

(Continued)

*Primary Examiner* — Rehana Perveen
*Assistant Examiner* — Alfred H B Wechselberger
(74) *Attorney, Agent, or Firm* — Rabin & Berdo, P.C.

(57) ABSTRACT

The present invention relates to a method for controlling a structural member design considering constructability of formwork, comprising: an initial input step S10 wherein drawing information including structural member information is inputted from an input unit; a recognition step S20 wherein space information and structural members are recognized from the drawing information; a space partitioning step S30 wherein arrangement spaces in which previously set standard forms are arranged are determined; a form arrangement step S40 wherein the previously set standard forms are virtually arranged; a coordinate determination step S50 wherein the coordinate positions of the previously set (Continued)

☐ NON-STANDARD FORMS
▧ STRUCTURAL MEMBERS (columns)

standard forms are recognized; and an optimization step S60 wherein the variable information of the structural members is changed.

9 Claims, 14 Drawing Sheets

(56) References Cited

FOREIGN PATENT DOCUMENTS

KR          10-1047527 B1      7/2011
KR    10-2012-0076574 A      7/2012

OTHER PUBLICATIONS

Lee et al. "The Development of Automatic Module for Formwork Layout using the BIM" [retrieved on Dec. 3, 2019]. Retrieved from <https://pdfs.semanticscholar.org/743a/c6065f2ff1e5b9c000f0752fd806c035dd9b.pdf> (Year: 2009).*

Skibniewski et al. "Automation in Concrete Construction" Chapter 18, Concrete Construction Eng Hndbk, pp. 1-19 [retrieve on Dec. 1, 2019]. Retrieve from <https://www.semanticscholar.org/paper/18-1-18-Automation-in-Concrete-Construction-Skibniewski-Kunigahalli/4bca7113231debbbefb091e73f3aaafbb0181ed> (Year: 2008).*

Chung et al. "Application of DOCC for Minimum Cost Design of Reinforced Concrete Continuous Beam" Korean Institute of Structural Engineering, Proceedings of the Falls Conference of 1999 [retrieved on Dec. 17, 2019]. Retrieved from STIC translation. (Year: 1999).*

Benoist et al. "Minimum Formwork Stock problem on residential buildings construction sites" 4OR-Q Journal of Operations Research, Oct. 2009, vol. 7, pp. 275-288 [retrieved on Dec. 18, 2019]. Retrieved from <https://link.springer.com/article/10.1007/s10288-008-0092-6#citeas> (Year: 2009).*

Khajehzadeh et al. "Economic design of . . . " Australian Jour of Basic & Applied Sciences, vol. 4,No. 11, pp. 5500-5507 [retrieved on Dec. 18, 2019]. Retrieve <https://www.researchgate.net/publication/230996874_Economic_design_of_retaining_wall_using_particle_swarm_ooptimization_with_passive_congregation> (Year: 2010).*

Lee et al. "A Formwork Layout Model based on Genetic Algorithm" The 31st International Symposium on Automation and Robotics in Construction and Mining [retrieved on Dec. 3, 2019]. Retrieved from <https://pdfs.semanticscholar.org/81db/1a3310c06d387941821a04023f46130fb90b.pdf> (Year: 2014).*

Lee et al. "A Formwork Arrangement Efficiency Support Model for Improving Constructability of Formwork Construction—Based on Structural Member Adjustment—" [retrieved on Dec. 10, 2019]. Retrieved from STIC translation. (Year: 2013).*

Ceranic et al. "A Genetic Algorithm Approach to the Minimum Cost Design of Reinforced Concrete . . . " University of Derby, Proc of International Australasian Conference on Struc. Optimization, pp. 71-78 [retrieved on Dec. 3, 2019]. Retrieved from <https://derby.openrepository.com/handle/10545/582933> (Year: 1998).*

Dongmin Lee et al., "A Support Model of Optimum Layout Planning of Forms for Improving Constructability of Formwork", 2013 Autumn Conference, vol. 13, No. 2, pp. 212-213, 2013.

* cited by examiner

METHOD FOR CONTROLLING STRUCTURAL MEMBER DESIGN CONSIDERING CONSTRUCTABILITY OF FORMWORK

BACKGROUND OF THE INVENTION

This application claims the benefit of Korean Patent Application No. 10-2016-0069564, filed on Jun. 3, 2016 and No. 10-2016-0082925, filed on Jun. 30, 2016 in the Korean Intellectual Property Office, which is incorporated herein by reference in its entirety.

FIELD OF THE INVENTION

The present invention relates to a method for controlling a structural member design considering constructability of formwork that is capable of suggesting a design process of structural members considering the constructability of formwork in the future, at the design step of the structural members, and also providing a design and construction collaboration platform through which a computer program-based design support module is suggested to actually perform the design process of the structural members.

BACKGROUND OF THE RELATED ART

Conventional structural member design tools do not reflect any constructability of formwork at a structural member design step because there is no method for reflecting the knowledge on the constructability of formwork at the design step. Accordingly, if the structural members are designed complicatedly or their position, size and shapes are different from standards of form panels, the efficiencies in the arrangement design of forms may be greatly decreased, which undesirably increases the number of non standard forms and the total number of form units.

In conventional form arrangements, the forms are simply arranged around the structural members, so that the qualities of the form arrangement results may be differently obtained according to the positions of the structural members, and in many cases, it is impossible to arrange the forms around the structural members.

Generally, the forms are arranged manually under a professional worker's experiences or determination, which undesirably requires a lot of time and endeavors. Besides, construction site elements like design or plane changes are not instantly reflected, and the qualities of form arrangement designs depend on the work ability of the professional worker.

SUMMARY OF THE INVENTION

Accordingly, the present invention has been made in view of the above-mentioned problems occurring in the prior art, and it is an object of the present invention to provide a method for controlling a structural member design considering constructability of formwork that is capable of suggesting a new structural member design process and a reasonable and consistent structural member design quality so as to at the same time conduct a structural member design and a form design on one drawing, so that an optimization algorithm like a harmony search algorithm is used to arrange structural members and forms on the drawing at the same time and to check the qualities of the arrangements through the comparison of alternatives, thereby assisting the determination of a form arrangement professional worker, continuously comparing the optimized structural member and form arrangement designs in a short period of time, and minimizing the time and endeavors consumed for the arrangement designs.

It is another object of the present invention to provide a method for controlling a structural member design considering constructability of formwork that is capable of reflecting the constructability of formwork at the design step of structural members, so that it provides an optimization algorithm-based structural member design, thereby minimizing the use of special forms (non-standard forms) greatly reducing the constructability of formwork upon the form arrangements at the conventional formwork process.

It is yet another object of the present invention to provide a method for controlling a structural member design considering constructability of formwork that is capable of standardizing most of special forms around structural members through layout adjustment (changes of sizes and positions of structural members) of 100 mm or under considering the standards of the forms, wherein in the conventional practice, the special forms are used around the structural members (columns and walls) but most form units do not match relatively small sizes of 100 mm or under, so that in this case, the special forms are forcedly utilized.

It is still another object of the present invention to provide a method for controlling a structural member design considering constructability of formwork that is capable of allowing standard forms to be easily recycled and advantageous in the reduction of a material cost, so that if a standard form ratio providing good constructability is increased, the constructability of the whole formwork can be improved, thereby achieving the improvement of productivity.

To accomplish the above-mentioned objects, the present invention is based on a structural member design process checking constructability of formwork by performing the structural design and a formwork design at the same time, and includes a space partitioning module for making a space where formworks could be arranged, a making and correction module for structural members and/or formworks, a structural member offsetting module for maintaining a distance between peripheral area of structural members and formwork unit, a obstacle recognition module for recognizing space of structural members and outside area of the drawing information as spaces not be allowed to arrange formworks, and a data processing and transferring module for communicating to performing data interchange with computer software system like AutoCAD, Excel, Visual Studio).

More specifically, To accomplish the above-mentioned objects, according to the present invention, there is provided a method for controlling a structural member design considering constructability of formwork, the method including: an initial input step wherein drawing information including structural member information is inputted from an input unit; a recognition step wherein on the basis of the drawing information inputted at the initial input step and previously set information stored in a storage unit, space information and structural members are recognized from the drawing information by means of a control unit connected to the input unit and the storage unit; a space partitioning step wherein on the basis of the recognized space information at the recognition step and the drawing information, arrangement spaces in which previously set standard forms are arranged are derived and determined; a form arrangement step wherein the previously set standard forms are virtually arranged in the derived and determined arrangement spaces at the space partitioning step, while having no interference with the structural members; a coordinate determination step wherein on the basis of the virtually arranged form layout at the form arrangement step, the coordinate positions of the previously set standard forms are recognized; and an optimization step wherein the previously set information stored in the storage unit includes form cost information, the variable information of the structural members, and objective functions making use of the form cost information and the variable information of the structural members and having the size information of the structural members as a variable, so that the variable information of the structural members is changed according to an operation control signal of the control unit to individually calculate the objective functions to allow a minimum cost function value to be obtained.

The initial input step may comprises a real region information input step wherein real region information included in the drawing information is inputted; a structural member position input step wherein the types and positions of the structural members are inputted; and an arrangement space section input step wherein the arrangement spaces where the previously set standard forms are virtually arranged are inputted.

The recognition step may comprises a drawing information recognition step wherein the drawing information including the space information is recognized by means of the control unit on the basis of the drawing information inputted at the initial input step S10 and the previously set information stored in the storage unit; and a structural member recognition step wherein the types and positions of the structural members in the recognized drawing information at the drawing information recognition step S21 are recognized.

The space partitioning step may comprise an arrangement space section deriving step wherein arrangement space sections from the virtual arranged spaces inputted at the arrangement space section input step are checked out; and an arrangement space determination step wherein the arrangement space sections checked at the arrangement space section deriving step are determined as arrangement spaces.

The form arrangement step may comprise a form space arrangement step wherein the previously set standard forms are positioned in the determined arrangement spaces at the arrangement space determination step by means of the control unit; and a structural member interference region removal step wherein the arrangements of the forms are removed from a region wherein interferences are generated between the form spaces arranged at the form space arrangement step and the structural members.

The coordinate determination step may comprise a ready layout determination step wherein the form arrangements in the arrangement spaces after the structural member interference region removal step is determined as a ready layout; and a coordinate deriving step wherein the form positions of the ready layout determined at the ready layout determination step are recognized and derived as coordinates.

The optimization step may comprise: a cost function calculation step wherein an operation is performed by the operation unit to calculate a cost, using the form cost, the variable information of the structural members, and the objective functions included in the previously set information according to the operation control signal applied from the control unit; and a cost minimum determination step wherein it is determined whether the cost calculated at the cost function calculation step is the minimum or not.

The previously set information may comprise an initial cost, and at the cost minimum determination step, the initial comparison with the calculated cost is carried out with the initial cost.

In the method, wherein if it is determined that the calculated cost is not the minimum cost by means of the control unit, a condition adjustment step in which the variable information of the structure members is adjusted to the previously set value may be further carried out by means of the control unit, and the control flow may be transferred to the cost function calculation step.

In the method, wherein if it is determined that the calculated cost is the minimum cost by means of the control unit, an optimized layout determination step may be further carried out so that a layout in which the current information of the structural members formed in the current step is reflected is determined as an optimized layout.

The objective function may have the following equation:

$$\text{Minimize} \sum_{j=1}^{m} \sum_{i=1}^{n} f_{price}(L_i, W_j)$$

$$\text{If} \begin{cases} \forall \exists (X_C, Y_C) \text{ and } (X_{L_i}, Y_{W_j}), \\ |X_C - X_{L_i}| < \frac{1}{2}(L_i + L_C) \text{ and } |Y_C - Y_{W_j}| < \frac{1}{2}(W_j + W_C) \end{cases}$$

then, $f_{price}(L_i, W_j) = \alpha \times f_{price}(L_i, W_j)$, ($\alpha$ = Penalty Constant)

$(L_i, W_j) \in \{(L_i, W_j) \mid L_i \in L, W_j \in W\}$ wherein, $L_i$ is the length of the i-th arranged form panel, Wj is the width size of the j-th arranged form panel, Lc is the length size of a column, Wc is the width size of a column, Xc is the x axis coordinate of the column, Yc is the y axis coordinate of the column, $X_{L_i}$ is the x axis coordinate of the i-th arranged form panel, and $Y_{W_j}$ is the y axis coordinate of the j-th arranged form panel.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
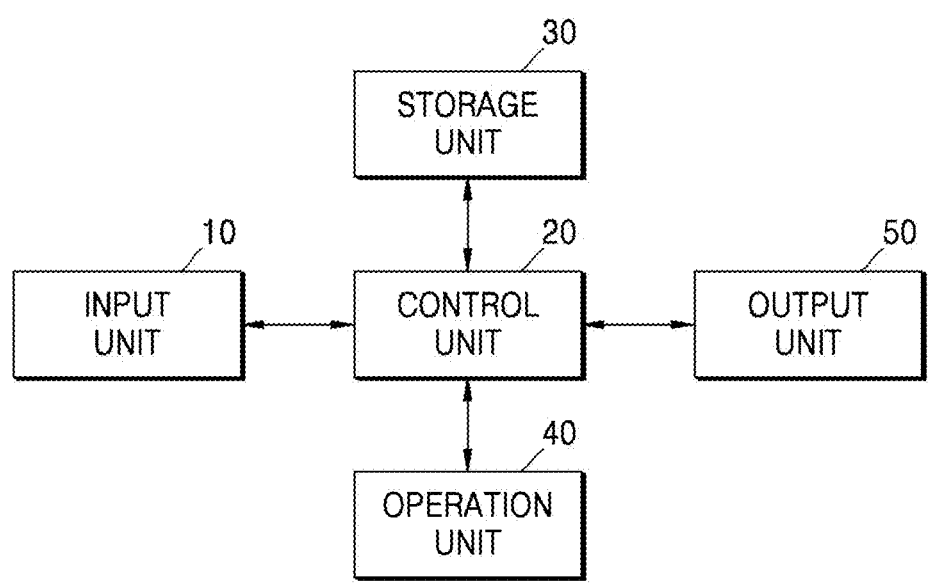
FIG. 1 is a block diagram showing a device through which a method for controlling a structural member design considering constructability of formwork according to the present invention is carried out.

A method for controlling a structural member design considering constructability of formwork according to the present invention is carried out through a device for designing a structural member considering constructability of formwork. As shown in FIG. 1, the device for designing a structural member considering constructability of formwork according to the present invention includes an input unit 10, a control unit 20, a storage unit 30, an operation unit 40, and an output unit 50. Drawing information including structural member information is inputted from the input unit 10, and the control unit 20 is connected to the input unit 10, the storage unit 30, the operation unit 40 and the output unit 50 and applies an input control signal, a storage control signal, an operation control signal, and an output control signal to them. The storage unit 30 stores the inputted drawing information or previously set information. The operation unit 40 is operated according to the operation control signal of the control unit 20 to conduct a given operation process, and according to the present invention, the operation unit 40 operates objective functions through the variable information on the structural members and thus calculates a cost. The output unit 50 may be a display or printer, which is selected freely according to specifications.

Hereinafter, the method for controlling a structural member design considering constructability of formwork according to the present invention will be explained with reference to the attached drawings. The method for controlling a structural member design considering constructability of formwork according to the present invention includes an initial input step S10, a recognition step S20, a space partitioning step S30, form arrangement step S40, a coordinate determination step S50, and an optimization step S60.

At the initial input step S10, first, the drawing information including the structural member information is inputted from the input unit 10. In this case, the structural member information means the information on members constituting frames like columns, walls and so on.

In more detail, the initial input step S10 includes a real region information input step S11, a structural member position input step S13 and an arrangement space section input step S15.

At the real region information input step S11, the real region information included in the drawing information is inputted, and that is, the drawing information of the real region for an object region to be designed by a designer is inputted.

Figure 2:
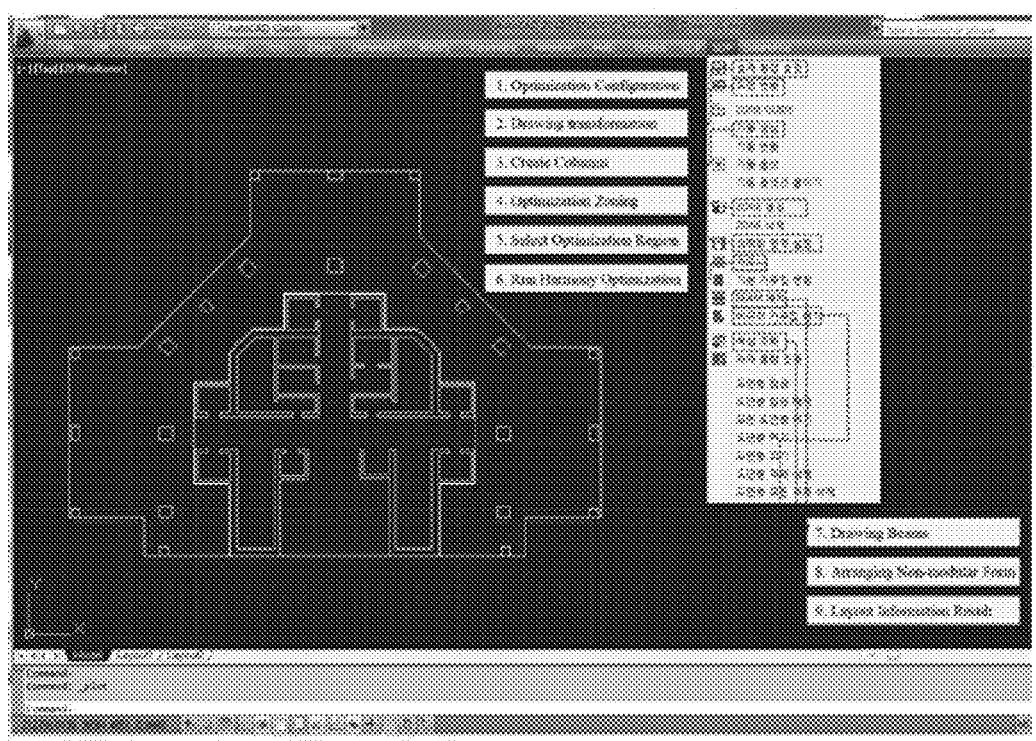
FIG. 2 is a screen showing the interference check in the method for controlling a structural member design considering constructability of formwork according to the present invention.

After that, the structural member position input step S13 is carried out, and at this step, the types and positions of the structural members like the columns, walls and so on are inputted. Accordingly, the positions of the structural members are schematically indicated on the drawing information of the real region. Such structural members are objectified to the form of templates, and accordingly, the structural member information including the sizes, positions, types and shapes of the structural members is adjusted through the input unit 10 (See FIG. 2). Through such objectified display, the production and correction of the structural members can be easily carried out, and further, information can be easily inserted or corrected on the objects on the drawing. However, the objectified display is the same as a typical design program, and therefore, an explanation on the objectified display will be avoided for the brevity of the description.

At the arrangement space section input step S15, next, arrangement space section information for setting regions where previously set standard forms are virtually arranged are inputted. For example, the arrangement regions are divided by portions where the planes on the drawing information are bent or portions where the arrangement directions of the columns as the structural members are changed, so that the adjustment of the structural members and the arrangements of the forms in the future can be simplified in one direction, thereby minimizing the uses of the non-standard forms or producing an optimized layout. Through such arrangement space section information, the information on the regions where the forms are arranged can be provided.

After that, the recognition step S20 is carried out wherein the initial information inputted from the input unit 10 at the initial input step S10 is recognized by means of the control unit 20, and at the recognition step S20, space information and the structural members are recognized from the drawing information by means of the control unit 20 connected to the input unit 10 and the storage unit 30 on the basis of the drawing information inputted at the initial input step S10 and the previously set information stored in the storage unit 30. In more detail, the database for each object in the inputted drawing, that is, the drawing information, is carried out, and the structural members (columns and walls) and the outside region from the drawing are designated as regions where the forms are not arranged. Further, a previously set gap, for example, a spare gap of 100 mm is designated around each structural member, thereby preventing the interference between the forms and the respective structural members from occurring.

In more detail, the recognition step S20 includes a drawing information recognition step S21 and a structural member recognition step S23.

Figure 3:
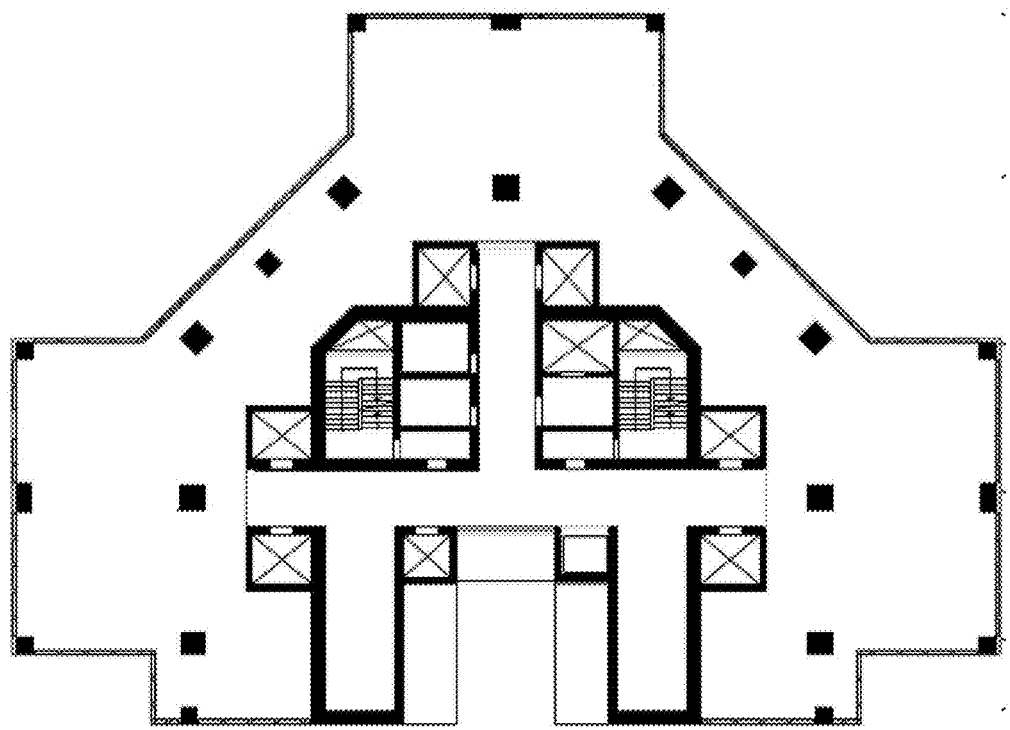
FIGS. 3 to 10 are screens showing design drawings and designing environments in the method according to the present invention.

At the drawing information recognition step S21, the drawing information including the space information is recognized by means of the control unit 20 on the basis of the drawing information inputted at the initial input step S10 and the previously set information stored in the storage unit 30. At this step, the database for each object in the drawing information is carried out, and the structural members (columns and walls) and the outside region from the drawing are designated as the regions where the forms are not arranged (See FIG. 3).

Figure 4:
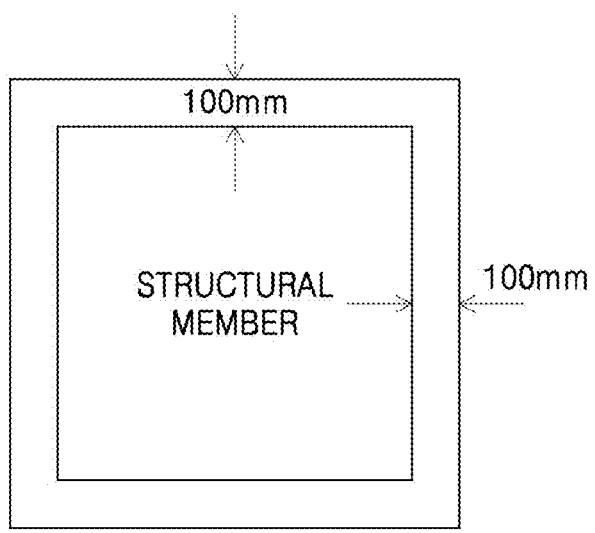
Figure 5:
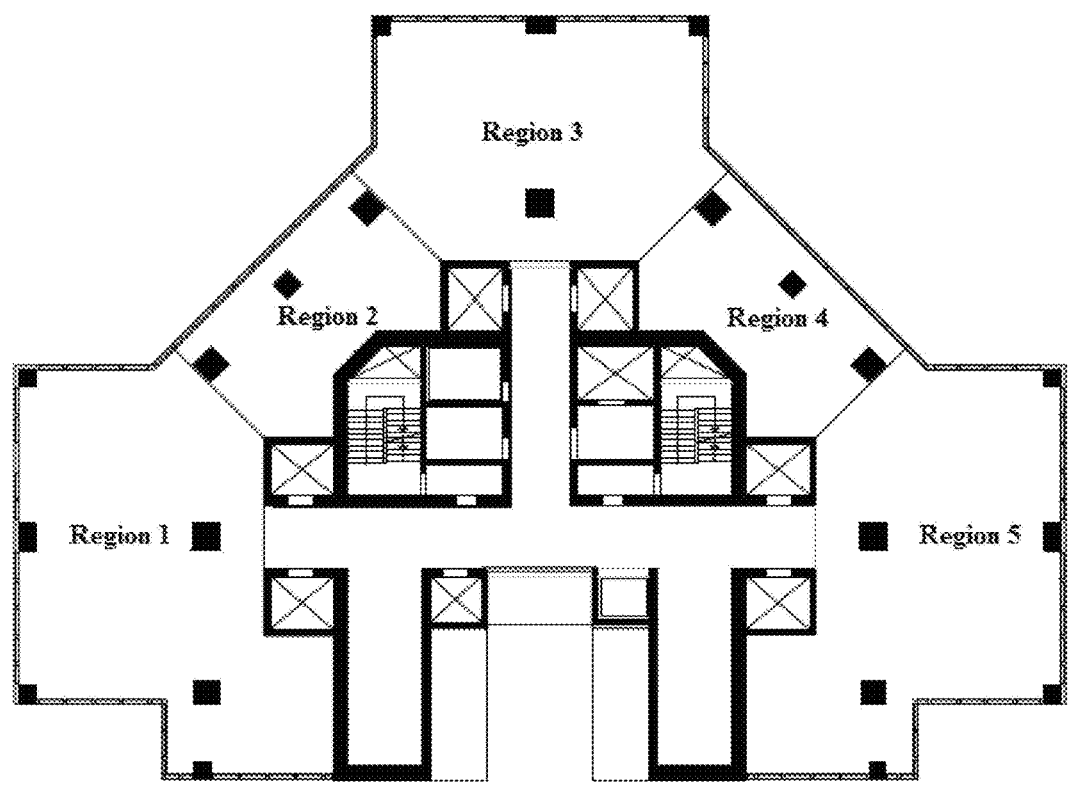
Figure 6:
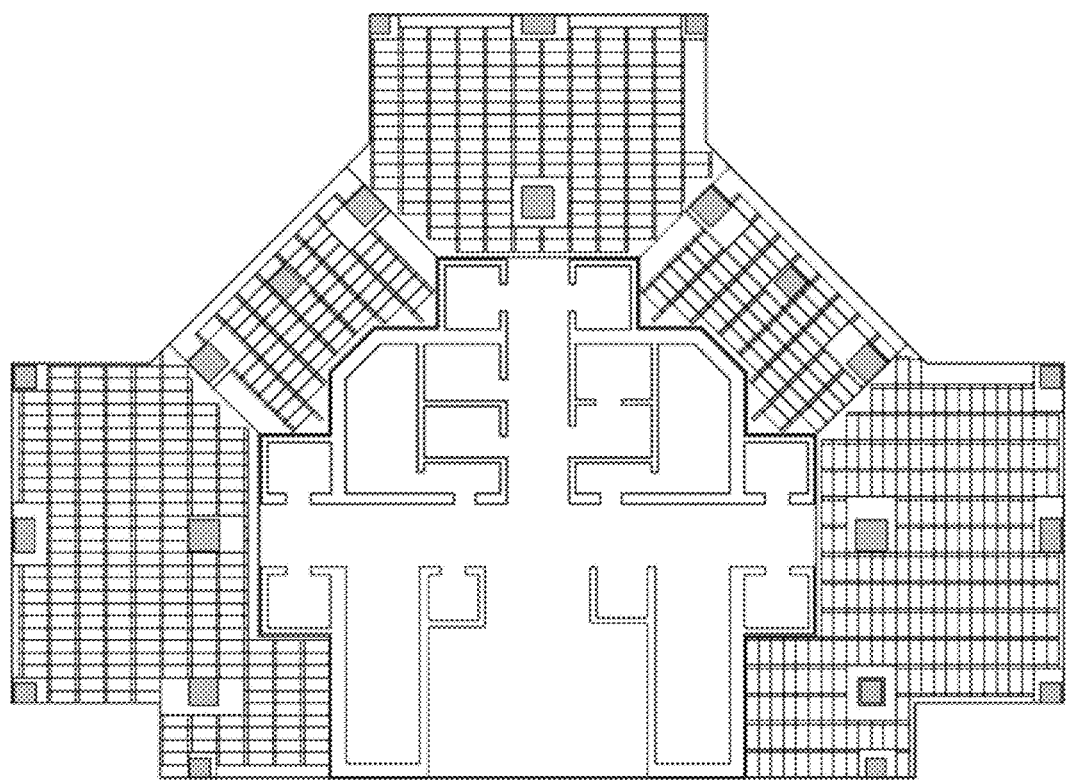
Figure 7:
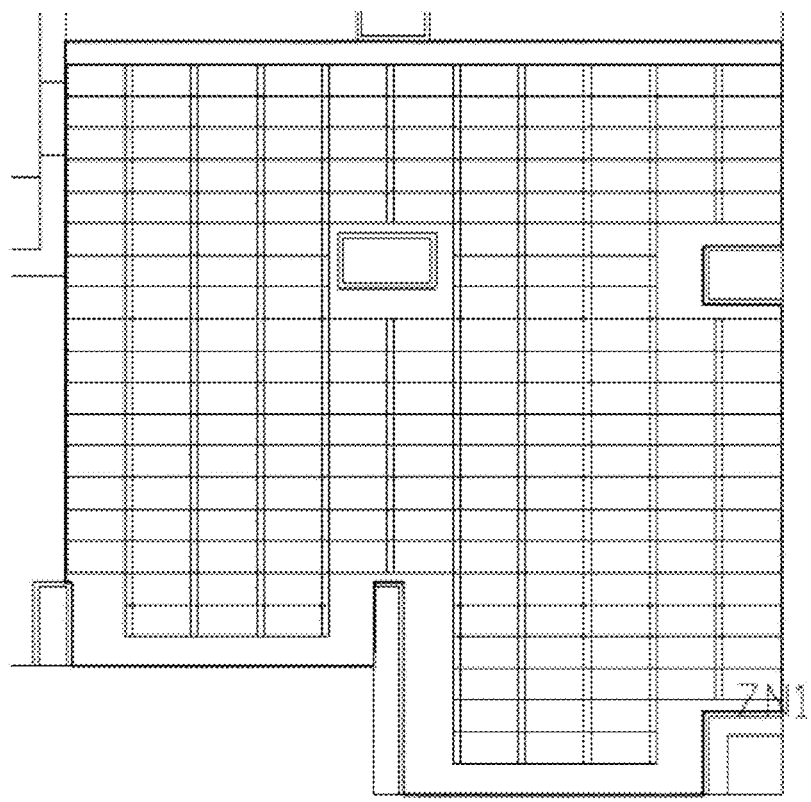
Figure 8:
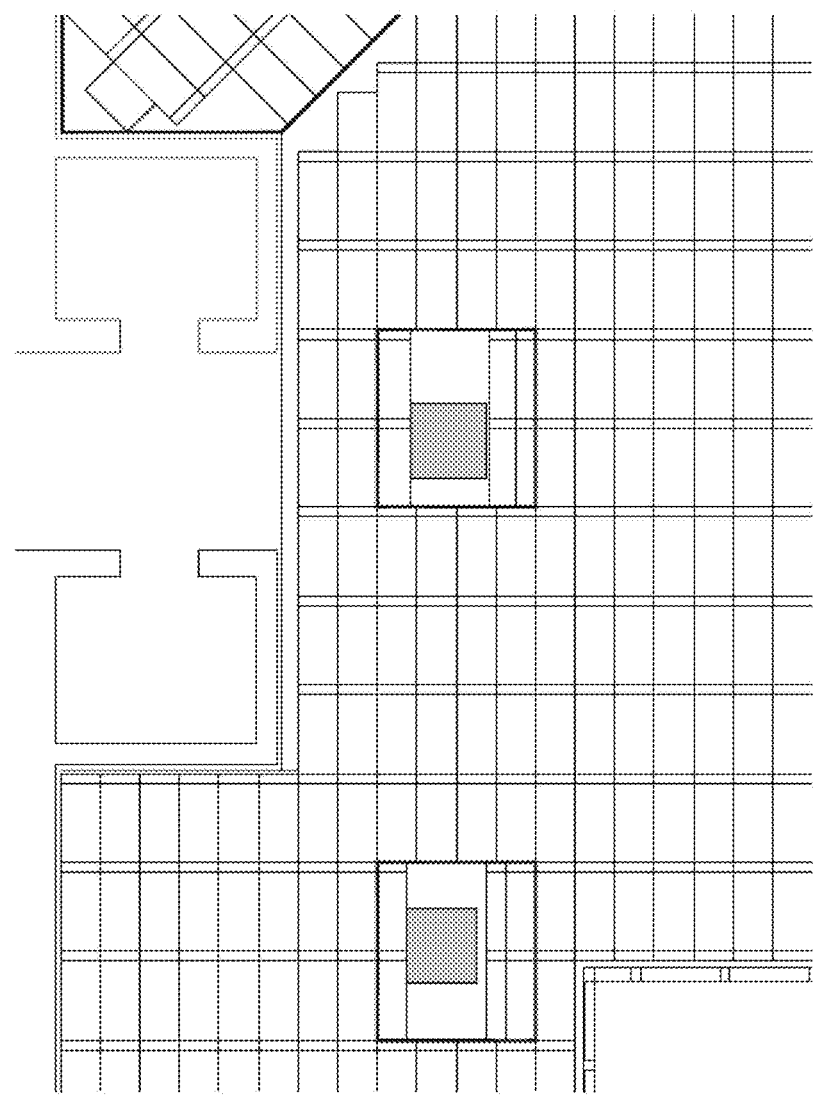

After that, the structural member recognition step S23 is carried out wherein the types and positions of the structural members in the recognized drawing information at the drawing information recognition step S21 are recognized and the space information on the space including the structural members is recognized. The structural members are selected from the recognized drawing information so that the regions where the structural members are arranged may be designated as the regions in which the forms are not arranged. Further, the previously set gap, for example, the spare gap of 100 mm is designated around each structural member, so that the occurrence of interference between the respective structural members and other components, that is, the forms can be prevented and minimized (See FIG. 4).

After that, the space partitioning step S30 is carried out. At the space partitioning step S30, arrangement spaces in which previously set standard forms are arranged are derived and determined by means of the control unit 20 on the basis of the recognized space information and drawing information at the recognition step S20.

That is, the space partitioning step S30 includes an arrangement space section deriving step S31 and an arrangement space determination step S33. At the arrangement space section deriving step S31, arrangement space sections from the virtually arranged regions inputted at the arrangement space section input step S15 from the input unit 10 are checked out from the storage unit 30 by means of the control unit 20, and at the arrangement space determination step S33, the arrangement space sections checked at the arrangement space section deriving step S31 are determined as the arrangement spaces in which the forms are arranged by means of the control unit 20.

Next, the form arrangement step S40 is carried out. At the form arrangement step S40, the previously set standard forms, which are included in the previously set information stored in the storage unit 30, are virtually arranged in the derived and determined arrangement spaces at the space partitioning step S30 by means of the control unit 20, while having no interference with the structural members under the space information. That is, the forms (form panels) most advantageous to construction, that is, the previously set standard forms as the standard forms and the forms separately set by a user are arranged as many as possible in the arrangement spaces, and upon the arrangements, if portions of the template virtual forms are overlapped with the regions in which it is impossible to arrange the forms, the corresponding forms (form panels) are removed, which is set as the regions in which forms are not arranged. In this case, the regions in which the forms are not arranged between the structural members and the forms are automatically set as optimized regions.

In more detail, the form arrangement step S40 includes a form space arrangement step S41 and a structural member interference region removal step S43. At the form space arrangement step S41, the previously set standard forms are positioned in the determined arrangement spaces at the arrangement space determination step S33 by means of the control unit 20, and at the structural member interference region removal step S43, the arrangements of the forms are removed from the regions in which interferences are generated between the form spaces arranged at the form space arrangement step S41 and the structural members.

After that, the coordinate determination step S50 is carried out by means of the control unit 20.

At the coordinate determination step S50, in more detail, the coordinate positions of the previously set standard forms are recognized from the arrangement layout virtually formed at the form arrangement step S40, and the coordinate determination step S50 includes a ready layout determination step S51 and a coordinate deriving step S53. At the ready layout determination step S51, the form arrangements in the arrangement spaces after the structural member interference region removal step S43 are determined as a ready layout by means of the control unit 20, and the ready layout is stored in the storage unit 30. At the coordinate deriving step S53, the form positions of the ready layout determined at the ready layout determination step S51 are recognized and derived as coordinates.

Next, the optimization step S60 is carried out. At the optimization step S60, the ready layout is applied to an optimized algorithm model so that through the optimized layout of the structural members and the standard forms except the basic standard forms, the form arrangements around the structural members are newly carried out, and in this process, non-standard forms are arranged in the regions in which it is hard to arrange the forms.

In more detail, the previously set information stored in the storage unit 30 includes form cost information, the variable information of the structural members, and the objective functions. The objective functions make use of the form cost information and the variable information of the structural members and has the size information of the structural members as a variable.

The objective functions are checked wherein they are capable of calculating the form cost, while at the same time adjusting the layout of the structural members and the arrangements of the standard forms in the sections set as the optimized regions. For example, the layout of the structural members is adjusted to the previously set size value according to the variable information of the structural members. In more detail, as the width (length) sizes of the structural members are reduced to the units of a given size (for example, 50 mm) as the variable information or as the structural members are moved in every direction, the previously set standard forms are arranged to search the layout in which the number of forms arranged is the maximum. If a plurality of kinds of previously set standard forms is provided, the costs per region by the previously set standard form kind are stored in the storage unit 30. At this time, a low cost is applied to the standard forms having good constructability and easily recyclable, thereby ensuring good constructability in the formwork through the minimization in the material cost.

Figure 9:
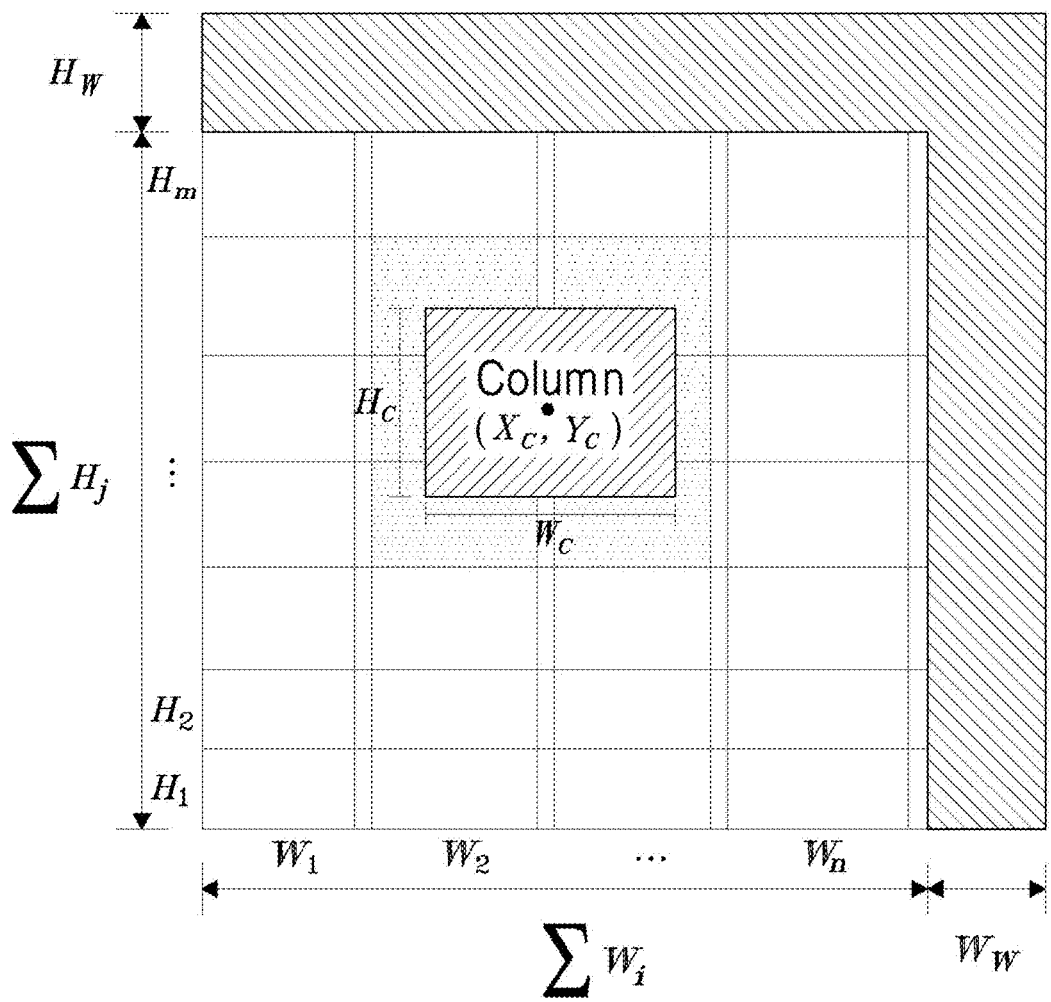
Figure 10:
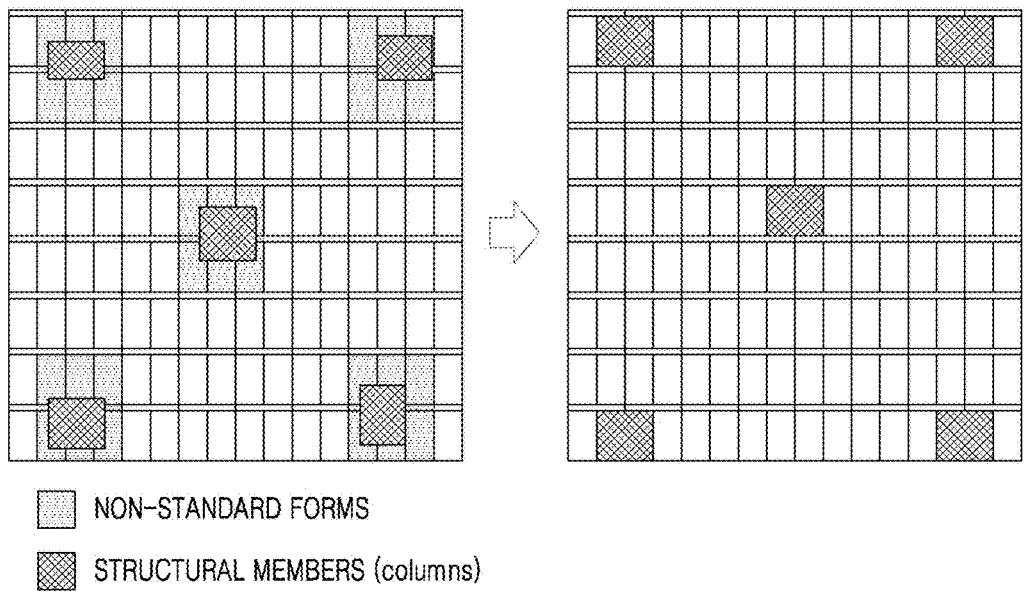
Figure 11:
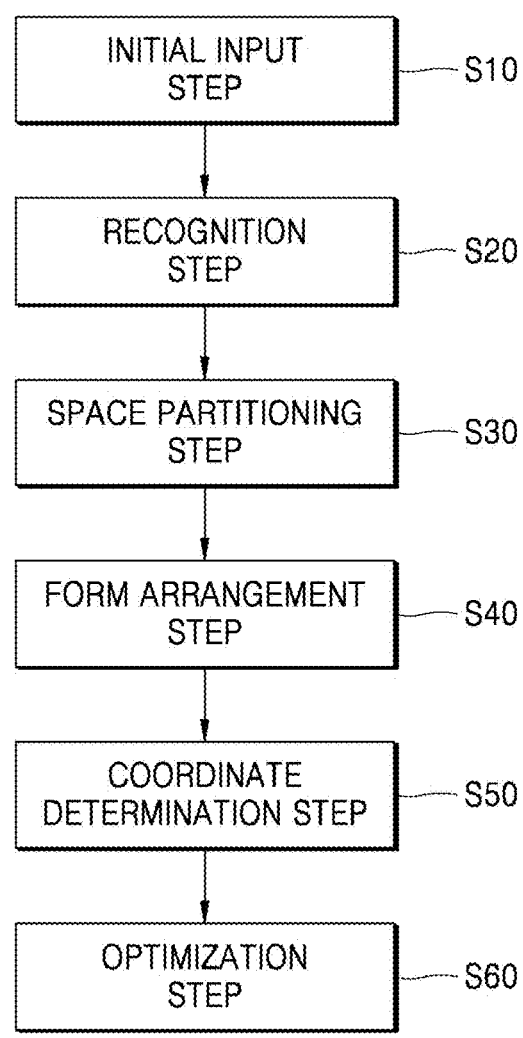
FIGS. 11 to 17 are flow charts showing the method for controlling a structural member design considering constructability of formwork according to the present invention.
Figure 12:
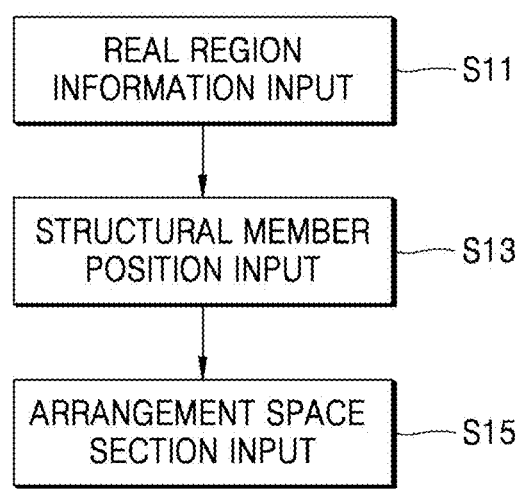
Figure 13:
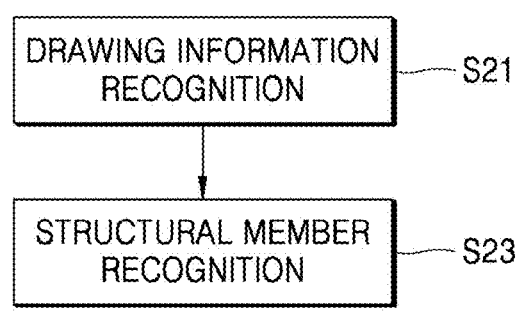
Figure 14:
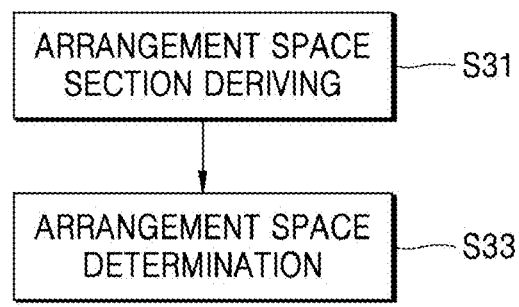
Figure 15:
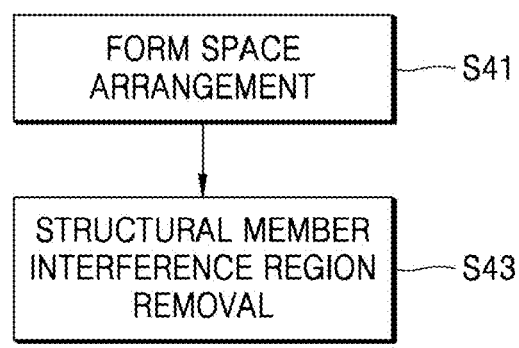
Figure 16:
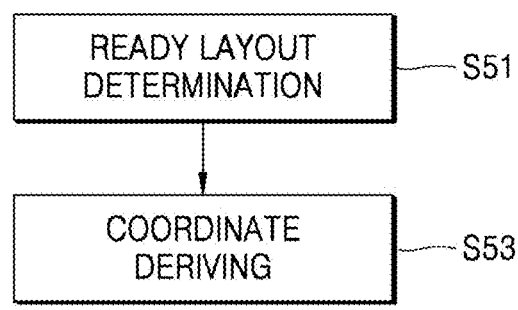
Figure 17:
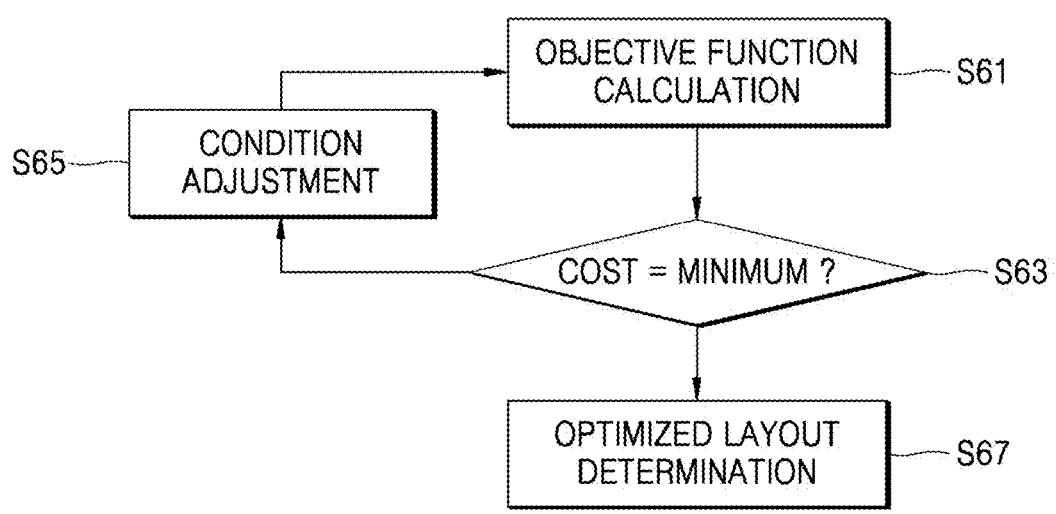

An exemplary structure for optimizing the arrangement of one structural member is shown in FIG. 9, and the objective function is as follows:

$$\text{Minimize} \sum_{j=1}^{m} \sum_{i=1}^{n} f_{price}(L_i, W_j)$$

$$\text{If} \begin{cases} \forall \exists (X_C, Y_C) \text{ and } (X_{L_i}, Y_{W_j}), \\ |X_C - X_{L_i}| < \frac{1}{2}(L_i + L_C) \text{ and } |Y_C - Y_{W_j}| < \frac{1}{2}(W_j + W_C) \end{cases}$$

then, $f_{price}(L_i, W_j) = \alpha \times f_{price}(L_i, W_j)$, ($\alpha$ = Penalty Constant)

$(L_i, W_j) \in \{(L_i, W_j) \mid L_i \in L, W_j \in W\}$

FIG. 9 shows a column, an obstacle for the formwork, and its Cartesian coordinates $X_c$, $Y_c$) (the width ($W_c$) and the length ($L_c$) are given). Any interference between the column and formwork can be recognized as an interference area (shaded red). Formwork panels are arranged on the floor plan along the same width and length, and all panels are individual objects that have their own coordinates and size. When arranging the formwork panels, the widths ($W_1$, $W_2$, $W_3$ ... $W_m$) are selected from the standard and semistandard (which have a degree of utilization higher than special forms even if they are not standard forms) data set, and the lengths ($L_1$, $L_2$, $L_3$ ... $L_n$) are also selected from the data set. A $W_j$ and a $L_i$ make a formwork panel ($W_j \times L_i$). As described previously, 24 types of standard and semistandard formwork panels are included in the data set step S10.

The interference between the current form and the column as the structural member occurs at the region with a red color, so that the standard form cannot be disposed at the region with the red color, and instead of the previously set standard form, accordingly, a new special form is made and disposed at the region with the red color. The costs per region for the arbitrarily arranged forms are previously determined and stored as the previously set information in the storage unit 30, so that the material costs of the arranged forms can be quantitatively calculated. For example, if the previously set standard form panels, which are the most easily utilized, have units of 600×1200, the costs of the forms having the units of 600×1200 are calculated as the lowest costs and inputted in the storage unit 30. On the other hand, the costs per unit region for the special forms are calculated higher by two times than those for the standard form panels and inputted in the storage unit 30. As a result, costs for various form arrangements can be compared with each other. In case of the layout having a high arrangement ratio of standard form panels, the costs per region for the forms are low, and contrarily, in case of the layout in which a lot of special forms are arranged, the costs per region for the forms are high. If the objective function is set to the minimization of the form cost, improvements are continuously carried out in the control process to search the form arrangement having the minimized form cost. The number of cases in which the cost per unit region higher than the cost of the special form is calculated and inputted to the regions where the forms are not arranged can be removed. The design control method through the form cost calculation should be carried out independently of the check for the structural stability of the column. For example, the changes in the layout in the small range of 100 mm or under have big influences on the structural stability of the column. According to the present invention, therefore, the optimization step S60 is desirably set at the step in which an initial design is made on the nominal region of the column at the initial design step of the structure members, not set at the step where the structural checks for the structural members have been finished, and through the individualized structural check, after that, the structural stability of the column is ensured through bar arrangement.

Referring in more detail to the optimization step S60 by step, the operation control signal is applied to the operation unit 40 by means of the control unit 20 at the optimization step S60, and the variable information of the structure members is changed according to the operation control signal applied from the control unit 20 by means of the operation unit 40 so that the objective functions are calculated individually to obtain a minimum cost function value.

In more detail, the optimization step S60 includes a cost function calculation step S61 and a cost minimum determination step S63.

At the cost function calculation step S61, an operation is performed by means of the operation unit 40 to calculate a cost, using the form cost, the variable information of the structural members, and the objective functions included in the previously set information according to the operation control signal applied from the control unit 20.

According to the present invention, as mentioned above, the objective function has the following equation:

$$\text{Minimize} \sum_{j=1}^{m} \sum_{i=1}^{n} f_{price}(L_i, W_j)$$

$$\text{If} \begin{cases} \forall \exists (X_C, Y_C) \text{ and } (X_{L_i}, Y_{W_j}), \\ |X_C - X_{L_i}| < \frac{1}{2}(L_i + L_C) \text{ and } |Y_C - Y_{W_j}| < \frac{1}{2}(W_j + W_C) \end{cases}$$

$$\text{then, } f_{price}(L_i, W_j) = \alpha \times f_{price}(L_i, W_j), (\alpha = \text{Penalty Constant})$$

$$(L_i, W_j) \in \{(L_i, W_j) \mid L_i \in L, W_j \in W\}$$

wherein, $L_i$ is the length of the i-th arranged form panel, Wj is the width size of the j-th arranged form panel, Lc is the length size of a column, Wc is the width size of a column, Xc is the x axis coordinate of the column, Yc is the y axis coordinate of the column, $X_{L_i}$ is the x axis coordinate of the i-th arranged form panel, and $Y_{W_j}$ is the y axis coordinate of the j-th arranged form panel.

That is, the price functions fprice of the form panels are functions which calculate the width and length sizes of the forms to obtain the prices of the corresponding standard forms. At this time, if an interference between the given form units $L_i$ and Wj and the column units Xc and Yc occurs, α as a penalty coefficient is applied to the objective function to provide penalty (through which the form prices are raised). During the optimization step S60, the forms are arranged in the space remaining except the column.

The above objective function is just exemplary function according to the present invention, and it may be freely varied according to the design specifications.

After that, the cost minimum determination step S63 is carried out by means of the control unit 20, and at this step, it is determined whether the cost calculated at the cost function calculation step S61 is the minimum or not.

The previously set information stored in the storage unit 30 includes an initial cost, and the initial cost is an initial set value for comparison steps, so that a big value may be arbitrarily stored. At the cost minimum determination step S63, the initial comparison with the calculated cost is carried out with the initial cost, but in some cases, the cost value calculated at the first time is stored as the initial cost, without having any separate comparison, which is of course varied freely according to the design specifications.

If it is determined at the cost minimum determination step S63 that the calculated cost is not the minimum cost by means of the control unit 20, a condition adjustment step S65 is carried out by means of the control unit 20. That is, the variable information of the structure members is adjusted to the previously set value by means of the control unit 20. Next, the control flow is transferred to the cost function calculation step S61 by means of the control unit 20, and at the cost function calculation step S61, the objective function is re-operated using the information of the structural members adjusted through the reflection of the variable information by means of the control unit 20. Accordingly, a new cost is calculated and a series of comparison steps are repeated.

On the contrary, if it is determined at the cost minimum determination step S63 that the calculated cost is the minimum cost by means of the control unit 20, an optimized layout determination step S67 is carried out by means of the control unit 20 wherein a layout in which the current information of the structural members formed in the current step is reflected is determined as an optimized layout.

As mentioned above, the method for controlling the structural member design considering constructability of formwork according to the present invention can conduct the design process to allow the form arrangement design to be carried out at the design step of the structural members, thereby considering the constructability of formwork at the design step of the structural members.

According to the present invention, in addition, the constructability of formwork has a relation with the sizes and shapes of the form panels arranged, and if the arrangement ratio of the standard forms having uniform sizes and rectangular shapes is increased, the constructability of the whole formwork can be improved, thereby achieving the reduction in the period of construction and in the material cost.

Further, there is no method for arranging and checking given regularized forms in the conventional form arrangements, so that the qualities of the form arrangement designs may depend on the worker's work ability and even in case of the structural member design, the design process is carried out by means of the worker's experiences and determination, but according to the present invention, the form arrangement design can be efficiently and objectifiedly provided.

According to the present invention, moreover, the module is provided to quantitatively estimate the constructability and form costs for respective alternatives after the structural member design has been finished, thereby advantageously achieving the reasonable comparison between various structural member design alternatives.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A method for controlling a structural member design considering constructability of formwork, the method comprising:
   an initial input step S10 wherein drawing information including structural member information is inputted from a graphical user interface;
   a recognition step S20 wherein on the basis of the drawing information inputted at the initial input step S10 and previously set information stored in a storage medium, space information and structural members are recognized from the drawing information by means of a control processor connected to the graphical user interface and the storage medium;
   a space partitioning step S30 wherein on the basis of the recognized space information at the recognition step S20 and the drawing information, arrangement spaces in which previously set standard forms are arranged are derived and determined;
   a form arrangement step S40 wherein the previously set standard forms are virtually arranged in the derived and determined arrangement spaces at the space partitioning step S30, while having no interference with the structural members;
   a coordinate determination step S50 wherein on the basis of a virtually arranged form layout at the form arrangement step S40, coordinate positions of the previously set standard forms are recognized; and
   an optimization step S60 wherein the previously set information stored in the storage medium includes form cost information, variable information of the structural members, and objective functions making use of the form cost information and the variable information of the structural members and having size information of the structural members as a variable, so that the variable information of the structural members is changed according to an operation control signal of the control processor to individually calculate the objective functions to allow a minimum cost function value to be obtained;
   wherein the initial input step S10 comprises an arrangement space section input step S15 wherein the arrangement spaces where the previously set standard forms are virtually arranged are inputted;
   wherein the space partitioning step S30 comprises:
   an arrangement space section deriving step S31 wherein arrangement space sections from the virtual arranged spaces inputted at the arrangement space section input step S15 are checked out; and
   an arrangement space determination step S33 wherein the arrangement space sections checked at the arrangement space section deriving step S31 are determined as arrangement spaces; and
   wherein an objective function of the objective functions has the following equation:

$$\text{minimize} \sum_{j=1}^{m} \sum_{i=1}^{n} f_{price}(L_i, W_j)$$

$$\text{If} \left\{ \begin{array}{l} \forall \exists (X_C, Y_C) \text{ and } (X_{L_i}, Y_{W_j}), \\ |X_C - X_{L_i}| < \frac{1}{2}(L_i + L_C) \text{ and } |Y_C - Y_{W_j}| < \frac{1}{2}(W_j + W_C) \end{array} \right\}$$

then, $f_{price}(L_i, W_j) = \alpha \times f_{price}(L_i, W_j)$, ($\alpha$ = Penalty Constant)

$(L_i, W_j) \in \{(L_i, W_j) \mid L_i \in L, W_j \in W\}$ $L_i$=Length of the i th formwork panel
$W_j$=Width of the j th formwork panel
$L_c$=Length of the Column
$W_c$=Width of the Column
$X_c$=X axis coordinate of Column
$Y_c$=Y axis coordinate of Column
$X_{L_i}$=X axis coordinate of the i th formwork panel
$Y_{W_j}$=Y axis coordinate of the j th formwork panel
$f_{initial\_price}$=pre-defined price of formwork according to their shape and size.

2. The method according to claim 1, wherein the initial input step S10 further comprises:
   a real region information input step S11 wherein real region information included in the drawing information is inputted; and
   a structural member position input step S13 wherein types and positions of the structural members are inputted.

3. The method according to claim 2, wherein the recognition step S20 comprises:
   a drawing information recognition step S21 wherein the drawing information including the space information is recognized by means of the control processor on the basis of the drawing information inputted at the initial input step S10 and the previously set information stored in the storage medium; and
   a structural member recognition step S23 wherein the types and positions of the structural members in the recognized drawing information at the drawing information recognition step S21 are recognized.

4. The method according to claim 1, wherein the form arrangement step S40 comprises:
   a form space arrangement step S41 wherein the previously set standard forms are positioned in the determined arrangement spaces at the arrangement space determination step S33 by means of the control processor; and
   a structural member interference region removal step S43 wherein arrangements of the forms are removed from a region wherein interferences are generated between form spaces arranged at the form space arrangement step S41 and the structural members.

5. The method according to claim 4, wherein the coordinate determination step S50 comprises:
   a ready layout determination step S51 wherein form arrangements in the arrangement spaces after the structural member interference region removal step S43 is determined as a ready layout; and
   a coordinate deriving step S53 wherein form positions of the ready layout determined at the ready layout determination step S51 are recognized and derived as coordinates.

6. The method according to claim 5, wherein the optimization step S60 comprises:
   a cost function calculation step S61 wherein an operation is performed by an operation processor to calculate a cost, using the form cost information, the variable information of the structural members, and the objective functions included in the previously set information according to the operation control signal applied from the control processor; and a cost minimum determination step S63 wherein it is determined whether the cost calculated at the cost function calculation step S61 is a minimum or not.

7. The method according to claim 6, wherein the previously set information comprises an initial cost, and at the cost minimum determination step S63, an initial comparison with the calculated cost is carried out with the initial cost.

8. The method according to claim 7, wherein if it is determined that the calculated cost is not the minimum cost by means of the control processor, a condition adjustment step S65 in which the variable information of the structural members is adjusted to a previously set value is further carried out by means of the control processor, and a control flow is transferred to the cost function calculation step S61.

9. The method according to claim 8, wherein if it is determined that the calculated cost is the minimum cost by means of the control processor, an optimized layout determination step S67 is further carried out so that a layout in which current information of the structural members formed in a current step is reflected is determined as an optimized layout.

* * * * *